(12) United States Patent
Dellmann et al.

(10) Patent No.: US 7,477,811 B1
(45) Date of Patent: Jan. 13, 2009

(54) METHOD OF FORMING A THREE-DIMENSIONAL STACKED OPTICAL DEVICE

(75) Inventors: Laurent Dellmann, Adliswil (CH); Michel Despont, Au (CH); Bert J. Offrein, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/054,784

(22) Filed: Mar. 25, 2008

(51) Int. Cl.
*G02B 6/12* (2006.01)

(52) U.S. Cl. .............................. 385/14; 438/26; 438/64

(58) Field of Classification Search .................... 385/14; 438/26, 64
See application file for complete search history.

(56) References Cited

U.S. PATENT DOCUMENTS

| | | | |
|---|---|---|---|
| 6,885,788 B2 * | 4/2005 | Iwaki et al. .................... | 385/15 |
| 7,215,032 B2 | 5/2007 | Trezza | |
| 7,271,461 B2 | 9/2007 | Dutta | |
| 2004/0124516 A1 * | 7/2004 | Nakamura et al. ........... | 257/685 |
| 2005/0169571 A1 * | 8/2005 | Kaneko et al. ................ | 385/14 |
| 2007/0222050 A1 | 9/2007 | Lee et al. | |
| 2007/0241437 A1 * | 10/2007 | Kagaya et al. ............... | 257/678 |
| 2007/0278644 A1 * | 12/2007 | Hsu et al. .................... | 257/686 |

* cited by examiner

*Primary Examiner*—Ellen Kim
(74) *Attorney, Agent, or Firm*—Cantor Colburn LLP; Martin Toleti

(57) ABSTRACT

A method of forming a three-dimensional stacked optical device includes forming a communication path on a transparent substrate and mounting at least one optical device to the communication path. The optical device includes a first surface, coupled to the transparent substrate that extends to a second surface. The method further includes embedding the at least one optical device in an insulating layer including a first surface, abutting the transparent substrate, extending to a second surface, and forming a communication path between the first surface of the optical device and the second surface of the insulating layer. The method also includes mounting an electronic chip to the second surface of the insulating layer. The electronic chip is coupled to the communication path so as to form a three-dimensional stacked optical device.

4 Claims, 4 Drawing Sheets

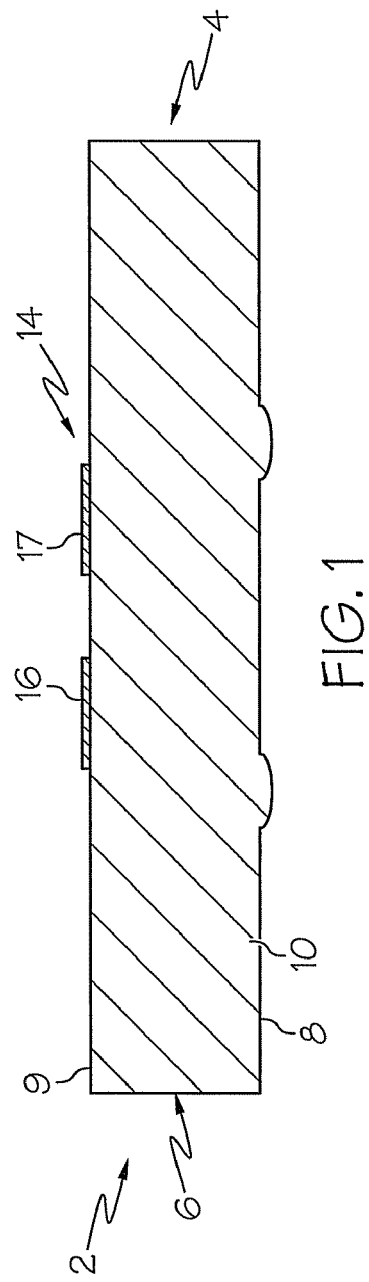
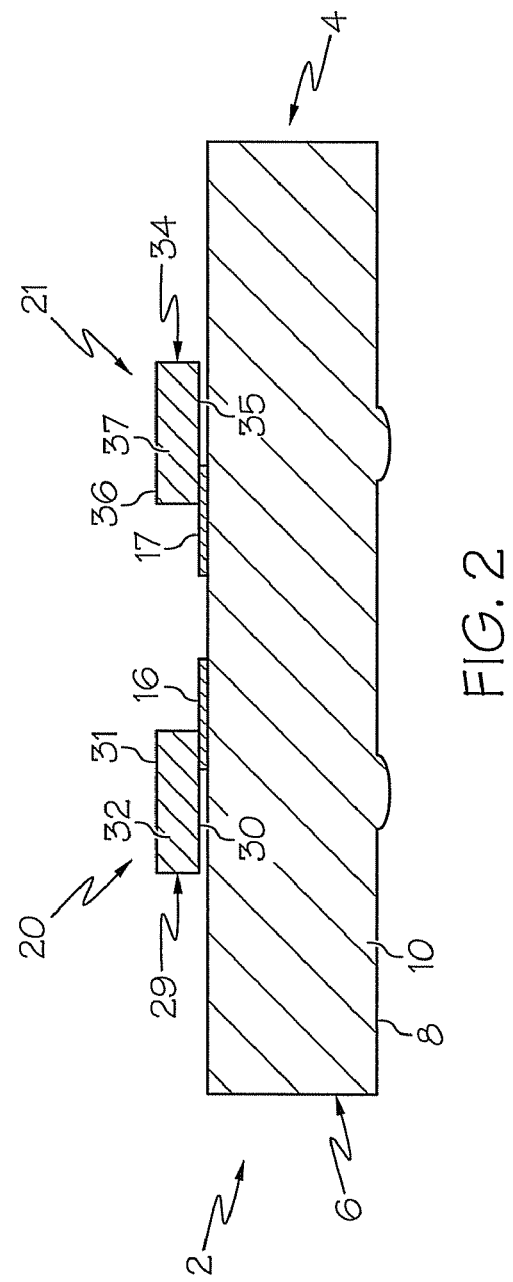

METHOD OF FORMING A THREE-DIMENSIONAL STACKED OPTICAL DEVICE

BACKGROUND OF THE INVENTION

1. Field of the Invention

This invention relates to the art of electronic devices and, more particularly, to a method of forming a three-dimensional stacked optical device.

2. Description of Background

Optical interconnect components are rapidly growing in popularity in the electronics industry. The need for higher communication bandwidth in newer electronic components is driving technology away from electrical communication busses. Electrical communication busses cannot meet increasing bandwidth requirements, predicted to exceed terabyte/second rates, foreseen for newer generation electrical devices. One technology currently being explored to meet the higher communication bandwidths is optical communication systems. However, even with the higher bandwidths afforded by optical communication systems, hundreds, up to more than a thousand, channels per processor module will be required to meet future communication needs. At present, existing optical packaging solutions present a challenge regarding assembly, cost and density to achieve a high number of channels. More specifically, current optical devices working at a standard wavelength of 850 nm emit and receive light on a side also provided with electrical contacts. Operational surfaces and contact on the same side limit packaging density and communication speeds.

SUMMARY OF THE INVENTION

The shortcomings of the prior art are overcome and additional advantages are provided through the provision of a method of forming a three-dimensional stacked optical device. The method includes forming a communication path on a transparent substrate and mounting at least one optical device to the communication path. The optical device includes a first surface, coupled to the transparent substrate that extends to a second surface through an intermediate portion. The method further includes embedding the at least one optical device in an insulating layer including a first surface, abutting the transparent substrate, extending to a second surface, and forming a communication path between the first surface of the optical device and the second surface of the insulating layer. The method also includes mounting an electronic chip to the second surface of the insulating layer. The electronic chip includes a first surface and a second surface with the first surface being coupled to the communication path so as to form a three-dimensional stacked optical device.

Additional features and advantages are realized through the techniques of exemplary embodiments of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates a transparent substrate portion including optical device connectors for a stacked, three-dimensional optical device constructed in accordance with exemplary embodiments of the present invention;

FIG. 2 illustrates optical devices mounted to the transparent substrate of FIG. 1;

Figure 3:
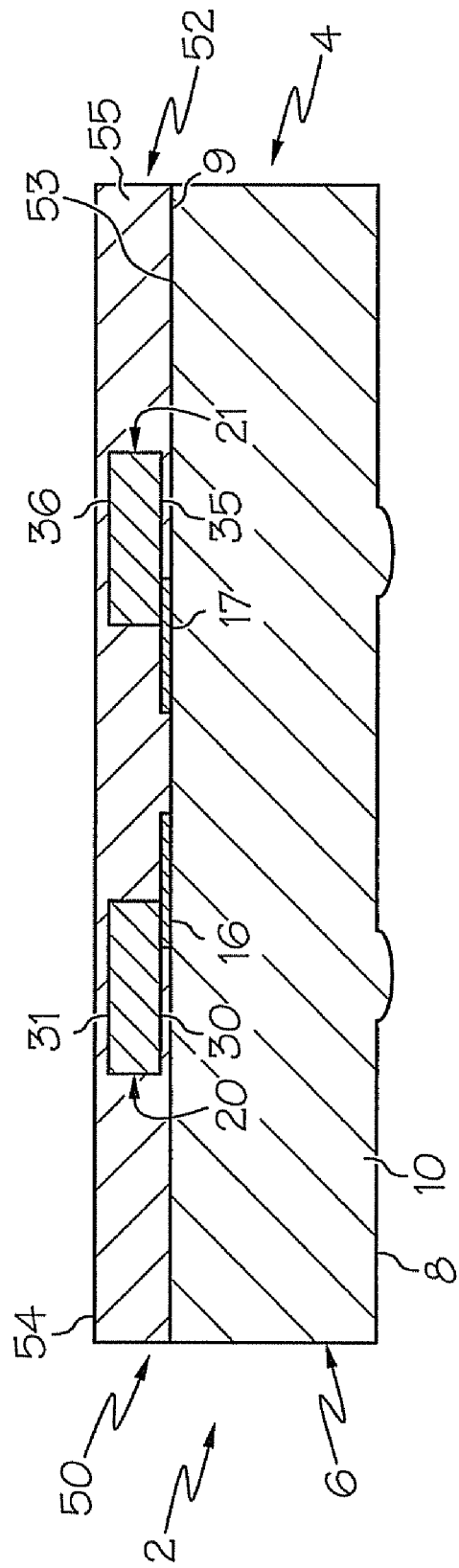
FIG. 3 illustrates the optical devices of FIG. 2 embedded in an insulating layer.

The detailed description explains the exemplary embodiments of the invention, together with advantages and features, by way of example with reference to the drawings.

DETAILED DESCRIPTION OF THE INVENTION

With initial reference to FIGS. 1 and 2, an electronic device constructed in accordance with exemplary embodiments of the present invention is generally indicated at 2. As shown, electronic device 2 includes a transparent substrate 4 having a main body 6 including a first surface 8 that extends to a second surface 9 through an intermediate portion 10. At this point it should be understood that the term "transparent" includes both a clear or substantially clear material, as well as openings or vias formed in a material, either transparent or opaque, that permit light to pass through the substrate. Electronic device 2 also includes a first communication path or interconnect layer 14 having first and second interconnect members 16 and 17 which, as will be described more fully below, provides a communication path for a pair of optical devices 20 and 21.

In accordance with the exemplary embodiment shown, optical devices 20 and 21 take the form of a vertical cavity surface emitting laser (VCSEL) device and photodiode (PD) device, mounted to second surface 9 of substrate 4. However, it should be understood that the type of optical device employed can vary in accordance with exemplary embodiments of the present invention. As shown, optical device 20 includes a main body 29 having a first surface 30 that extends to a second surface 31 through an intermediate portion 32. Similarly, optical device 21 includes a main body 34 having a first surface 35 that extends to a second surface 36 through an intermediate portion 37. Optical devices 20 and 21 are mounted to second surface 9 of substrate 4 through interconnect members 16 and 17. Once mounted to substrate 4, optical devices 20 and 21 are thinned, i.e., processed to have a thickness of less than 50 μm so as to be suitable for further processing.

As best shown in FIG. 3, once thinned to a desired thickness, optical devices 20 and 21 are embedded in an insulating layer 50. Insulating layer 50 is employed as a gap filling material for a subsequent planarizing process. Insulating layer 50 is planarized to form a main body 52 having a first surface 53 that abuts second surface 9 of substrate 4 and extends to a second, substantially planar surface 54 through an intermediate section 55. By being planarized, it should be understood that insulating layer 50 is processed such that second surface 54 is made substantially planar and intermediate portion made to have a substantially uniform thickness.

Figure 4:
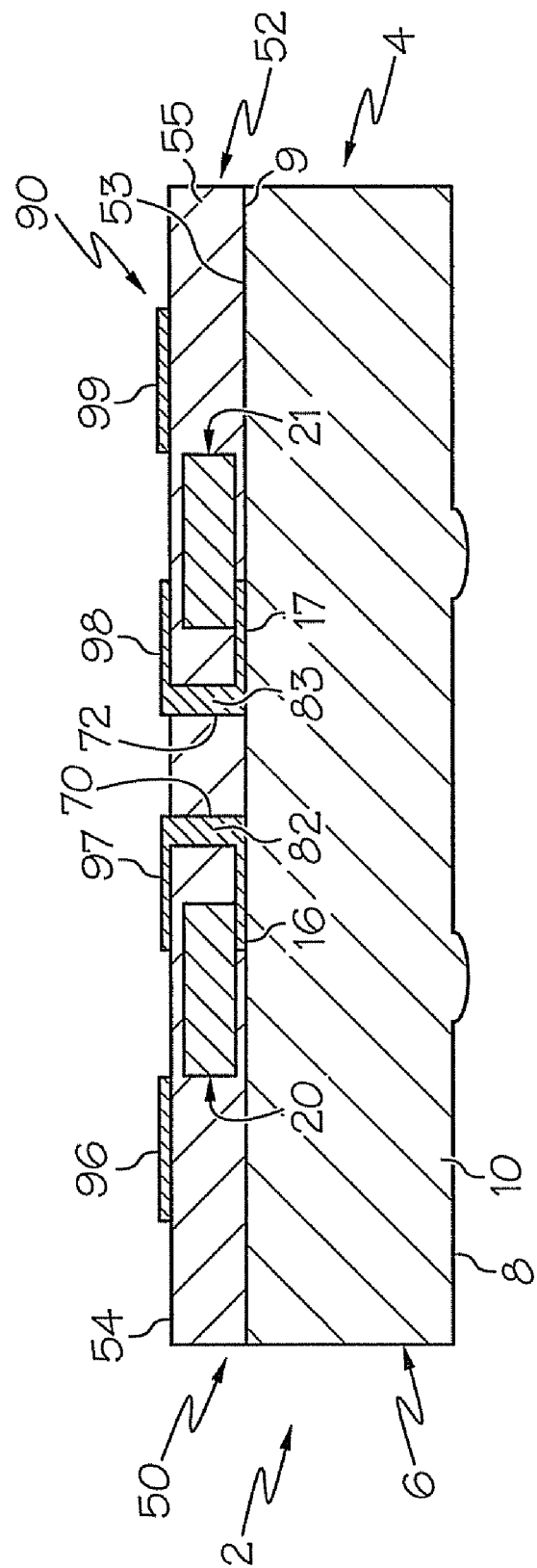
FIG. 4 illustrates a communication path extending from the optical devices to an outer surface of the insulating layer of FIG. 3.

At this point, a vias 70 and 71 are formed in insulting layer 50 as shown in FIG. 4. Vias 70 and 71 extend from second surface 54 of insulating layer 50 toward respective ones of interconnect members 16 and 17. Each via 70, 71 is provided with a corresponding conductive material member 82, 83 which, as will be discussed more fully below, establish a communication path to optical devices 20 and 21. At this point, a second interconnect layer 90 having a plurality of interconnect members 96-99 is deposited on second surface 54 of insulating layer 50. Interconnect members 96-99 provide a connection for an electronic component, shown in the form of a driver chip 120. (See FIG. 5) In addition, interconnect members 97 and 98 are coupled to conductive material members 82 and 83 positioned within vias 70 and 71.

Figure 5:
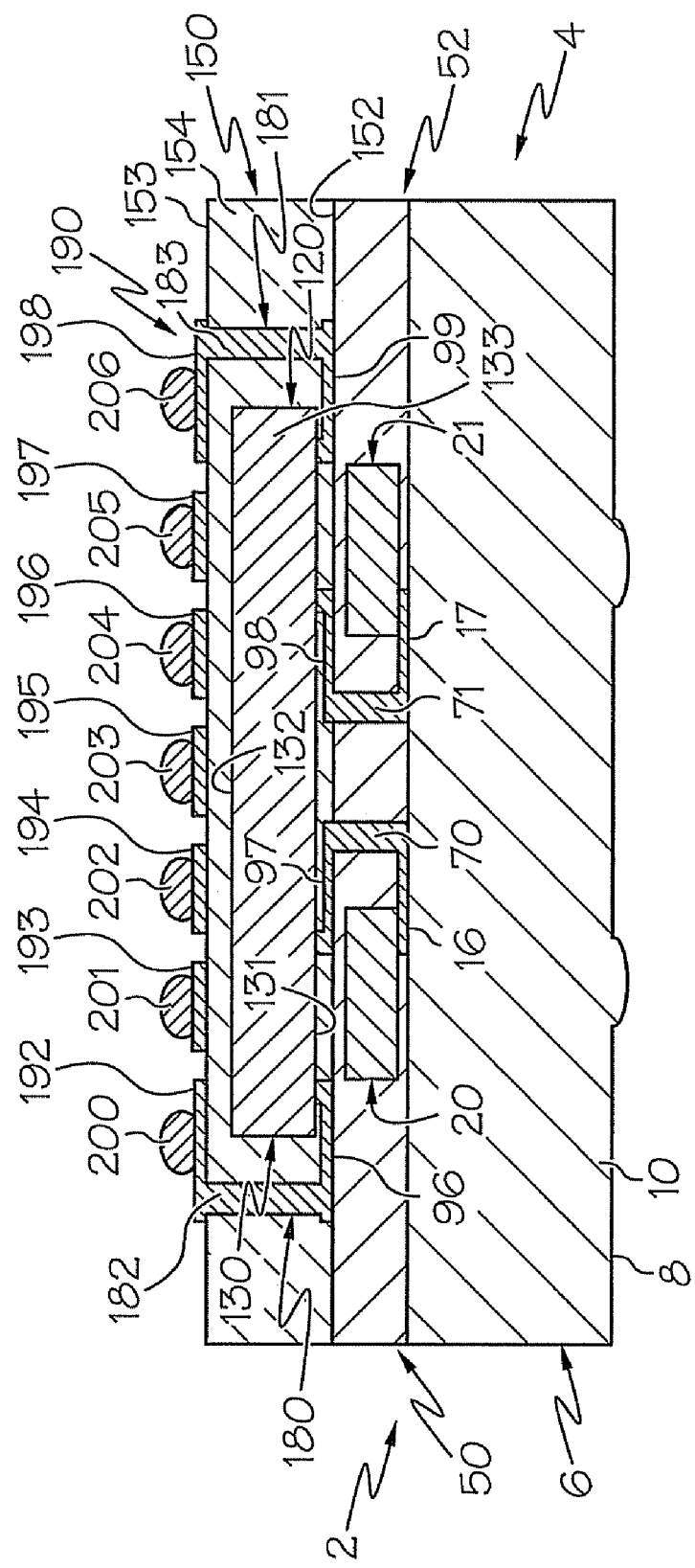
FIG. 5 illustrates an electronic chip embedded in an isolating layer and connected to the communication path of FIG. 4, and another communication path extending between the electronic chip and an outer surface of the isolating layer so as to establish a three-dimensional stacked optical device in accordance with exemplary embodiments of the present invention.

As best shown in FIG. 5, driver chip 120 includes a main body 130 having a first surface 131 that extends to a second surface 132 through an intermediate section 133. As indicated above, first surface 131 is coupled to interconnect members 96-99. In a manner similar to that described above with respect to optical devices 20 and 21, driver chip 120 is thinned so as to facilitate further processing, and embedded in an isolating layer 150. Isolating layer 150 includes a first surface 152 that abuts second surface 54 of insulating layer 50 and extends to a second surface 153 through an intermediate portion 154. Vias 180 and 181 are formed in isolating layer 150 and extend from second surface 153 toward interconnect members 96 and 99. Isolating layer 150 electrically isolates vias 180 and 180 from adjacent material layers. Conductive material members 182 and 183 are deposited in vias 180 and 181 respectively. Conductive material members 182 and 183 establish another communication path in electronic device 2. Towards that end, a third interconnect layer 190 is deposited on second surface 153 of isolating layer 150. Third interconnect layer 190 includes a plurality of interconnect members 192-198 that provide a connection point for other electronic components. Towards that end, each interconnect member 192-198 includes a corresponding connector member 200-206. In this manner, exemplary embodiments of the present invention provide an opto-electronic component that is capable of communication speeds exceeding terabyte/second rates, while at the same time enabling the use of multiple components to provide sufficient channels of communication all while maintaining a minimal foot print.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method of forming a three-dimensional stacked optical device, the method comprising:
    forming a communication path on a transparent substrate;
    mounting at least one optical device to the communication path on the transparent substrate, the at least one optical device having a first surface coupled to the communication path that extends to a second surface through an intermediate portion;
    embedding the at least one optical device in an insulating layer, the insulating layer including a first surface abutting the transparent substrate extending to a second surface;
    forming a communication path between the first surface of the optical device and the second surface of the insulating layer; and
    mounting an electronic chip to the second surface of the insulating layer, the electronic chip having a first surface and a second surface, the first surface being coupled to the communication path so as to form a three-dimensional stacked optical device.

2. The method of claim 1, further comprising: embedding the electronic chip in an isolating layer having a first surface, the first surface abuts the second surface of the insulating layer and extends to a second surface.

3. The method of claim 2, further comprising: establishing another communication path between the first surface of the electronic chip and the second surface of the isolating layer.

4. The method of claim 3, further comprising: mounting a plurality of connector members to the second surface of the isolating layer, the plurality of connector members being coupled to at least the another communication path.

* * * * *